(12) United States Patent
Tang et al.

(10) Patent No.: US 8,762,813 B2
(45) Date of Patent: Jun. 24, 2014

(54) CONFIGURABLE CODING SYSTEM AND METHOD OF MULTIPLE ECCS

(75) Inventors: Yu-Shuen Tang, Hsinchu (TW); Chuang Cheng, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 556 days.

(21) Appl. No.: 12/781,744

(22) Filed: May 17, 2010

(65) Prior Publication Data
US 2011/0283164 A1 Nov. 17, 2011

(51) Int. Cl.
*G11C 29/00* (2006.01)

(52) U.S. Cl.
USPC .......................................... 714/763; 714/746

(58) Field of Classification Search
None
See application file for complete search history.

(56) References Cited

U.S. PATENT DOCUMENTS

| | | | | |
|---|---|---|---|---|
| 5,428,627 A | * | 6/1995 | Gupta | 714/771 |
| 6,339,546 B1 | * | 1/2002 | Katayama et al. | 365/185.09 |
| 7,065,688 B1 | * | 6/2006 | Moyes et al. | 714/718 |
| 7,162,684 B2 | * | 1/2007 | Hocevar | 714/800 |
| 7,206,891 B2 | * | 4/2007 | Emerson et al. | 711/100 |
| 8,055,982 B2 | * | 11/2011 | Mulligan | 714/784 |
| 2011/0213945 A1 | * | 9/2011 | Post et al. | 711/173 |

* cited by examiner

*Primary Examiner* — Steve Nguyen
(74) *Attorney, Agent, or Firm* — Huffman Law Group, PC (57) ABSTRACT

A configurable coding system and method of multiple error correcting codes (ECCs) for a memory device or devices are disclosed. The system includes an ECC codec that selectively performs different error corrections with different parameters. The system also includes means for providing a selected parameter to the ECC codec for initializing the ECC codec. The parameter used for initializing the ECC codec is an error-free parameter.

11 Claims, 10 Drawing Sheets

CONFIGURABLE CODING SYSTEM AND METHOD OF MULTIPLE ECCS

BACKGROUND OF THE INVENTION

1. Field of the Invention

The present invention generally relates to coding, and more particularly to a configurable coding system and method of multiple error correcting codes (ECCs) for a memory device or devices.

2. Description of Related Art

The encoder/decoder or codec usually accompanies a non-volatile memory device such as a flash memory, which is error-prone, in order to correct error occurred during the memory access. The flash memory has evolved into many different types with varieties of information lengths and parity lengths. In some applications, there is a need for a flash controller to support different types of flash memory in the same chip, such that the data correctness may be assured no matter what type of flash is involved. In other words, the codec has to be configurable for multiple error correcting codes (ECCs).

However, multiple ECCs leads to multiple parameters for initializing the codec, while some parameters may be quite large in size. This may enlarge the circuit area of the codec or the flash controller. Further, storing the parameters in the codec or the controller may make the circuit design inflexible.

For the reason that conventional encoder/decoder could not effectively and economically provide multiple ECCs for the flash memory, a need has arisen to propose a novel coding system and method for relieving the codec of the burden of storing a large amount of parameters without incurring substantive cost.

SUMMARY OF THE INVENTION

In view of the foregoing, it is an object of the embodiment of the present invention to provide a configurable coding system and method of multiple ECCs for a memory device or devices in order to provide error-free parameters effectively and economically.

According to a first embodiment, an ECC codec is configured to selectively perform different error corrections with different parameters. At least one error-free storage device is configured to store error-free parameters, wherein a selected error-free parameter is loaded from the storage device to the ECC codec for initializing the ECC codec.

According to a second embodiment, an ECC codec is configured to selectively perform different error corrections with different parameters. An external memory device is configured to store the different parameters. A supplementary codec is configured to select and load one of the stored parameters from the external memory device, and then corrects the loaded parameter based on a built-in parameter, thereby generating an error-free parameter to be provided to the ECC codec for initializing the ECC codec.

According to a third embodiment, an ECC codec is configured to selectively perform different error corrections with different parameters. An error-free storage device is configured to store an error-free fixed parameter to be loaded to the ECC codec to initialize the ECC codec. An external memory device is configured to store the different parameters. The ECC codec selects and loads one of the stored parameters from the external memory device, and corrects the loaded parameter based on the fixed parameter, thereby generating an error-free parameter.

DETAILED DESCRIPTION OF THE INVENTION

Figure 1A:
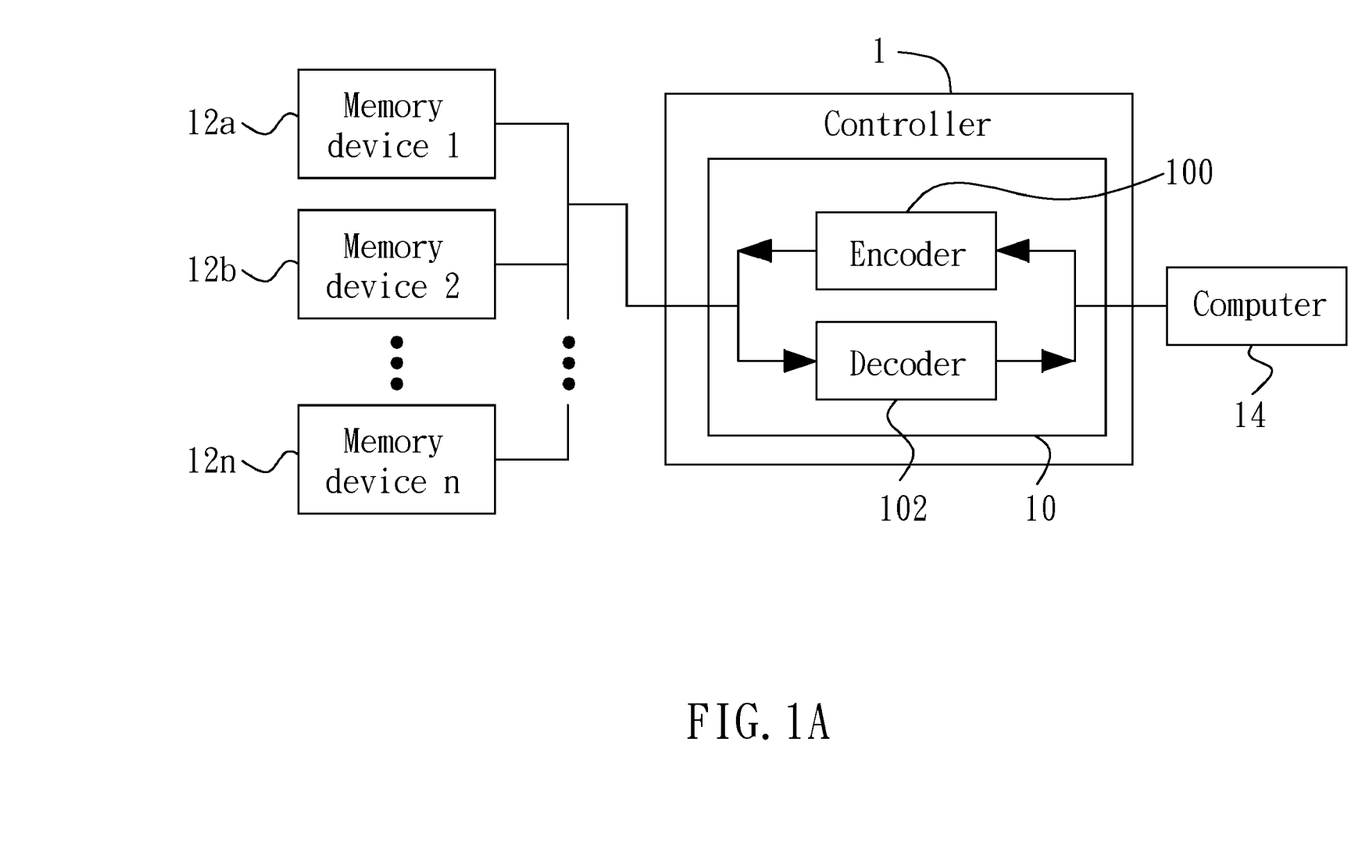
FIG. 1A shows a block diagram of a configurable codec of multiple error correcting codes (ECCs) for memory devices according to one embodiment of the present invention.

FIG. 1A shows a block diagram of a configurable codec 10 of multiple error correcting codes (ECCs) for memory devices 12a-12n according to one embodiment of the present invention. In the embodiment, the codec 10 is configurable for correcting error(s) using one of the multiple ECCs. For example, the codec 10 may be switched to the first ECC for the first memory device 12a at one time, and the same codec 10 may then be switched to the second ECC for the second memory device 12b at another time. The codec 10 may be a part of a controller 1, or may be separate from the controller 1. The controller 1 or the codec 10 may be further controlled, for example, by a computer 14. The memory devices 12a-12n, in the embodiment, may be error-prone memory devices such as flash memory devices that rely on ECC to correct bits that fail during normal device operation.

In the embodiment, the codec 10 primarily includes an encoder 100 and/or a decoder 102. In other words, the codec 10 may include both the encoder 100 and the decoder 102, or may include only the encoder 100, or may include only the decoder 102.

Figure 1B:
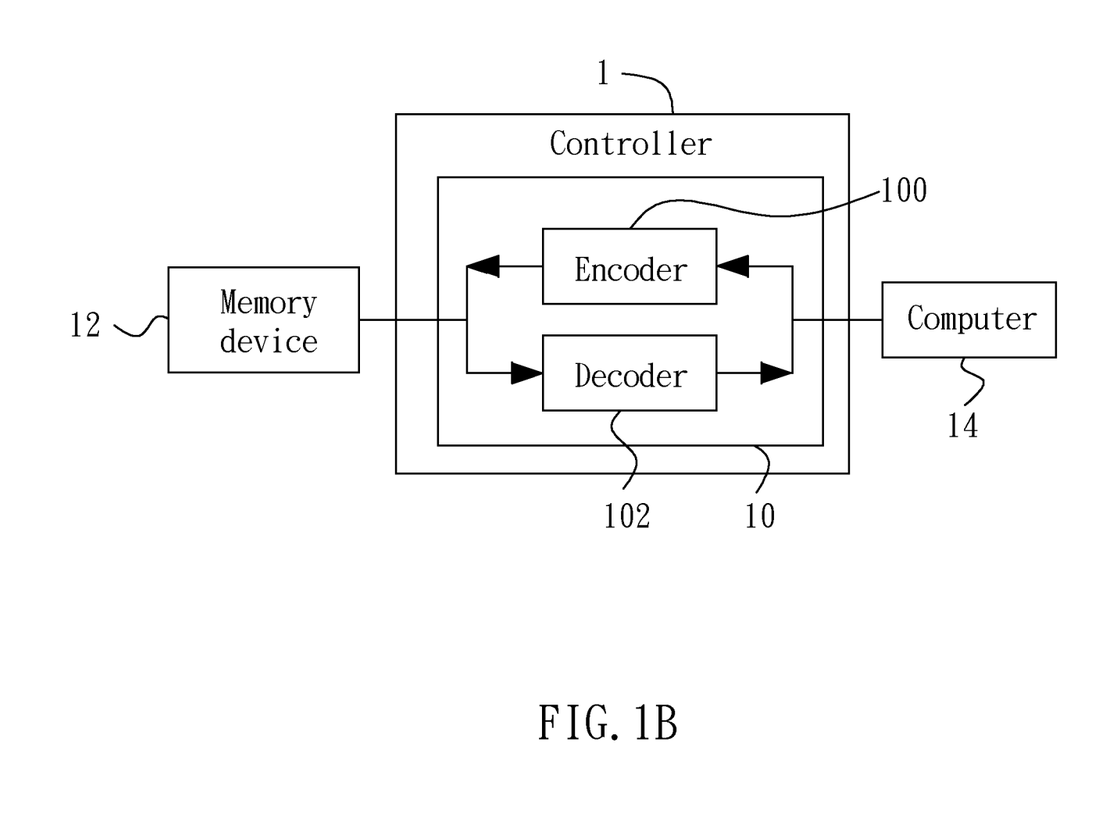
FIG. 1B shows a block diagram of a configurable codec of multiple ECCs for a memory device according to an alternative embodiment to FIG. 1A.

FIG. 1B shows a block diagram of a configurable codec 10 of multiple ECCs for a memory device 12 according to an alternative embodiment to FIG. 1A. In the embodiment, the memory device 12 comprises an array of non-volatile memory cells divided into a plurality of blocks, each of which contains a plurality of pages. The codec 10 may be configured to use different ECCs to correct error(s) of corresponding pages (or blocks) respectively.

Figure 2A:
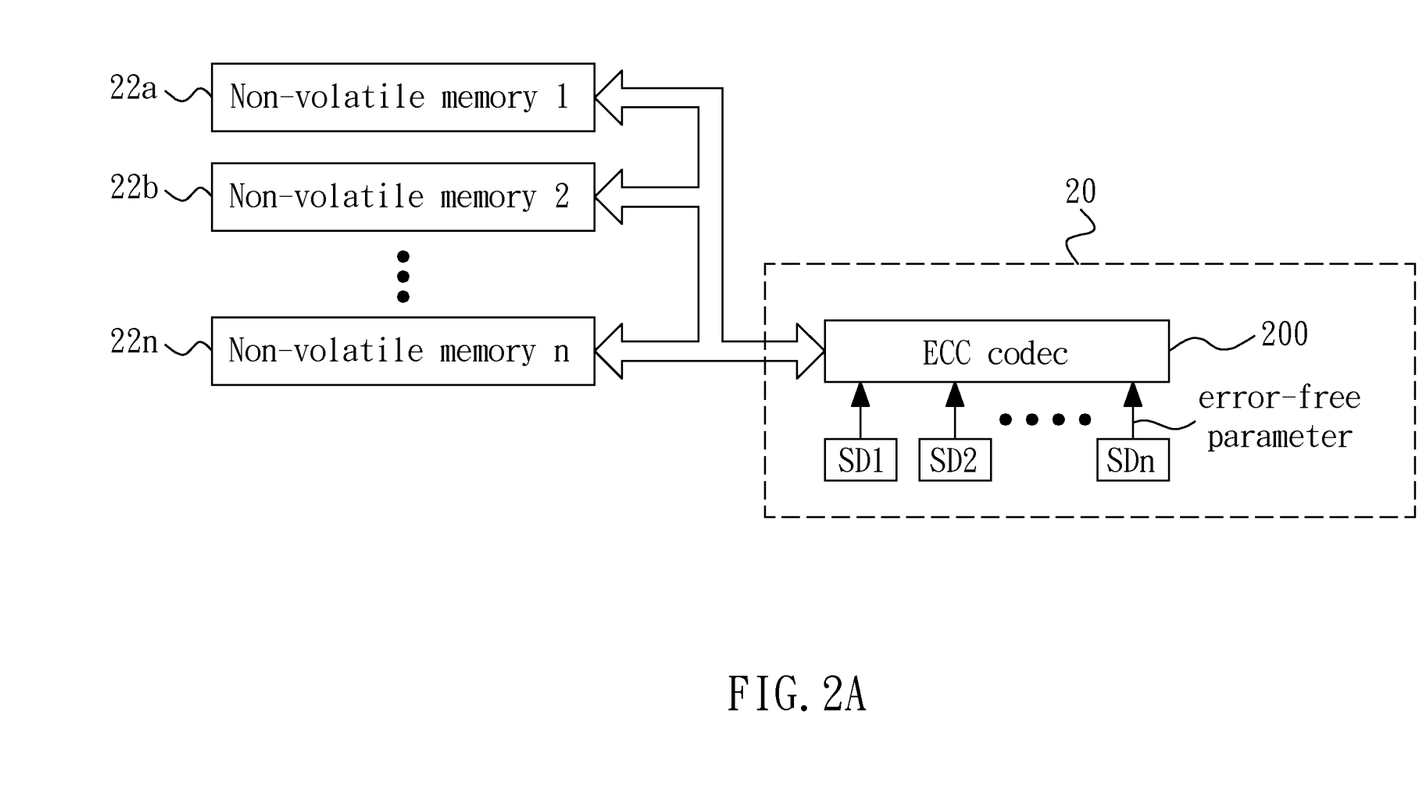
FIG. 2A shows a block diagram of a configurable coding system of multiple ECCs for memory devices according to a first specific embodiment of the present invention.
Figure 2B:
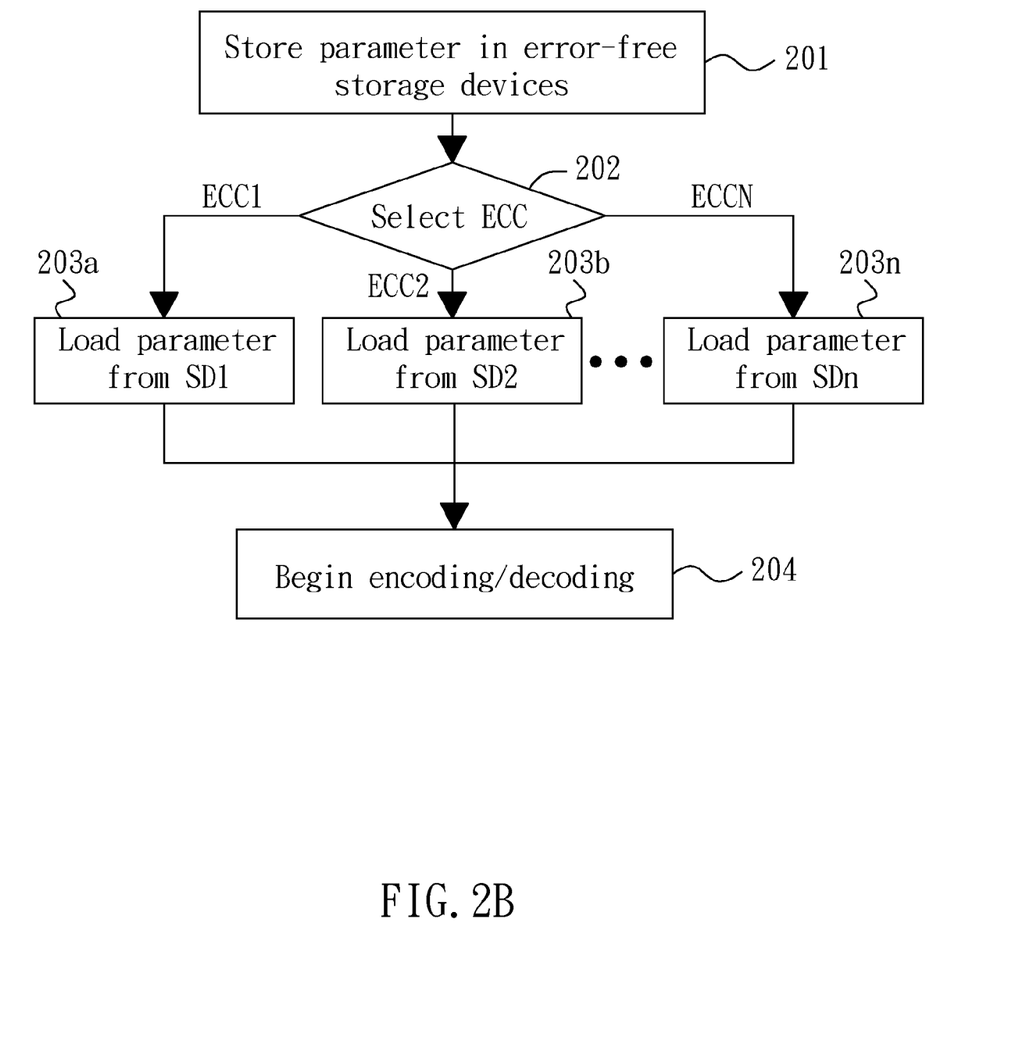
FIG. 2B shows a flow diagram of a configurable coding method of multiple ECCs for memory devices according to the first specific embodiment.

FIG. 2A shows a block diagram of a configurable coding system 20 of multiple ECCs for a memory device or devices such as non-volatile memories (22a-22n) (e.g., flash memory) according to a first specific embodiment of the present invention. FIG. 2B shows a flow diagram of a configurable coding method of multiple ECCs for memory devices according to the first specific embodiment.

In the embodiment, the coding system 20 includes an ECC codec 200 that is configurable of performing different error corrections for the distinct non-volatile memories (22a-22n). The coding system 20 further includes a number of error-free storage devices SD1 to SDn that are utilized to store parameters of different ECCs respectively, thereby providing error-free parameter(s) to the ECC codec 200. Each of the error-free storage devices SD1-SDn, in the embodiment, may be a static random access memory (SRAM) or a read only memory (ROM). The stored parameter(s) in each error-free storage device (SD1, SD2 . . . or SDn) are needed for initializing the ECC codec 200 or configuring status of the ECC codec 200 with respect to the corresponding error correction. In the specification, the error-free storage device has error probability substantially less than the error probability of an ECC codec. In other words, the probability of occurring error in the error-free storage device may be neglected in a practical application.

In step 201, parameter(s) are stored in the storage devices SD1-SDn. For example, the parameter(s) may be stored in the storages devices SD1-SDn such as ROMs before the coding system 20 is shipped out of a factory. Alternatively, the parameter(s) may be stored in the storage device SD1-SDn such as SRAMs by the computer 14 (FIG. 1A) at the user's end. Subsequently, in step 202, one of the configurable ECC codes is selected, for example, by a user. Next, parameter(s) needed for initializing the selected ECC in the ECC codec 200 are loaded from a corresponding storage device (SD1, SD2 . . . or SDn) to the ECC codec 200 in step 203a-203n. After finishing the initialization, in step 204, the ECC codec 200 is prepared to begin encoding and/or decoding for the data of the corresponding non-volatile memory (22a, 22b . . . or 22n) or the corresponding pages (or blocks) of the non-volatile memory (22a, 22b . . . or 22n). For example, if the second ECC (ECC2) is selected, parameter(s) are then loaded from the second storage device SD2, and the ECC codec 200 is then prepared to begin encoding and/or decoding for the data of the second non-volatile memory 22b. Another example, one of the ECCs is selected, parameter(s) are then loaded from one of the corresponding storage device (SD1, SD2 . . . or SDn), and the ECC codec 200 is then prepared to begin encoding and/or decoding for the data of the at least one page (or block) of the non-volatile memory (22a, 22b . . . or 22n).

According to the first embodiment, the ECC code of the codec 200 may be configured or changed simply by replacing previous parameter(s) with new parameter(s) loaded from one of the storage devices SD1-SDn. The ECC codec 200 accordingly will not bear the burden of storing a large amount of parameters in the ECC codec 200 itself.

Figure 2C:
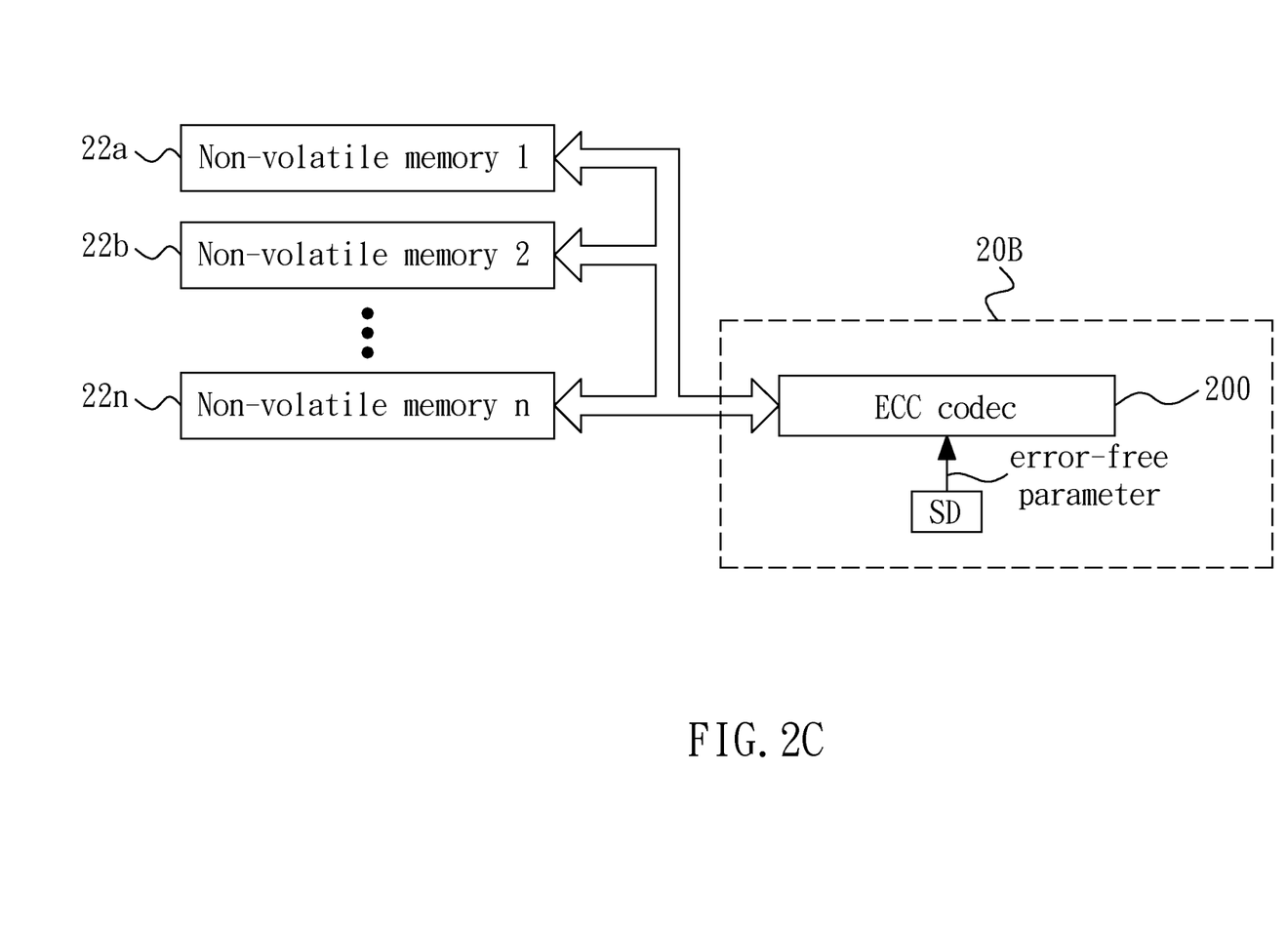
FIG. 2C shows a block diagram of a configurable coding system of multiple ECCs for memory devices according to an alternative embodiment to the first specific embodiment of FIG. 2A.
Figure 2D:
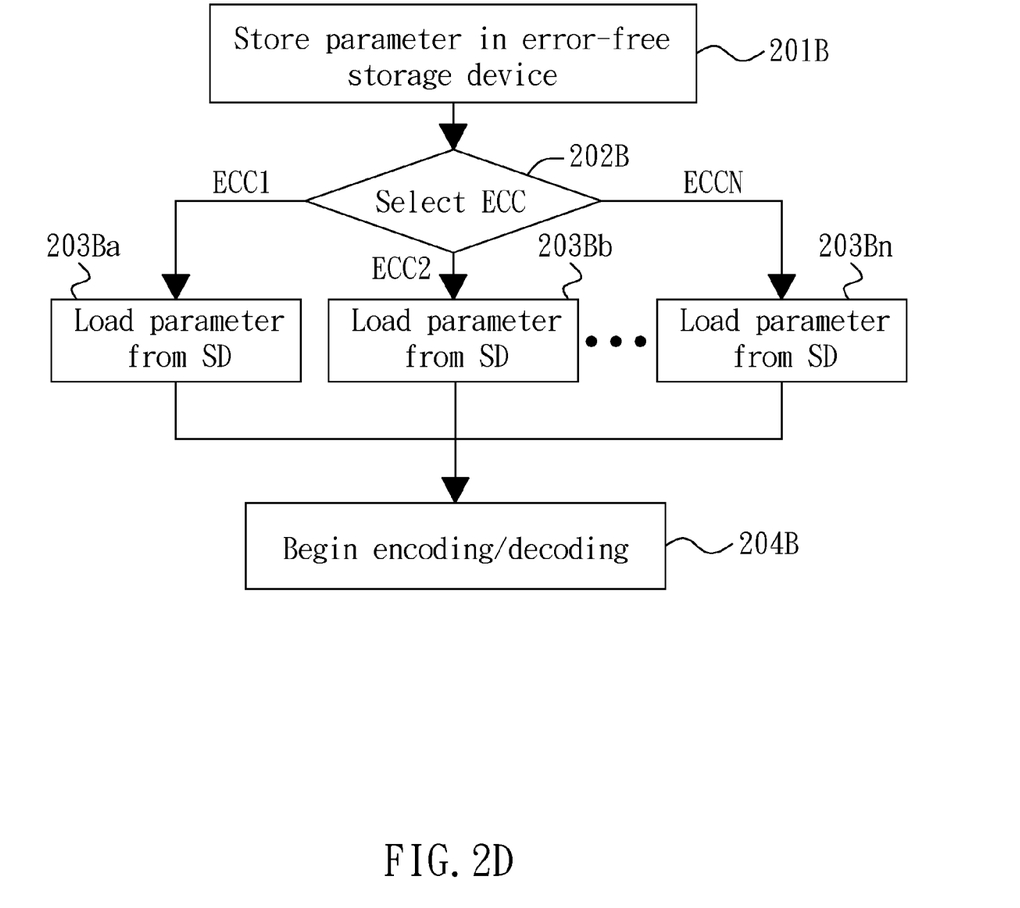
FIG. 2D shows a flow diagram of a configurable coding method of multiple ECCs for a memory device or devices according to the alternative embodiment of FIG. 2C.

FIG. 2C shows a block diagram of a configurable coding system 20B of multiple ECCs for a memory device or devices according to an alternative embodiment to the first specific embodiment of FIG. 2A. FIG. 2D shows a flow diagram of a configurable coding method of multiple ECCs for a memory device or devices according to the alternative embodiment of FIG. 2C.

In the embodiment, the coding system 20B is similar to the coding system 20, except that one error-free storage device SD is utilized to store parameters of different ECCs. In step 201B, parameters of multiple ECC codes are stored in the storage device SD. For example, parameters corresponding to different ECCs are stored at different addresses in the storage device SD. Subsequently, in step 202B, one of the configurable ECCs is selected. Next, in steps 203Ba-203Bn, parameter(s) needed for initializing the selected ECC in the ECC codec 200 are loaded from the storage device SD, for example, by addressing. After finishing the initialization, in step 204B, the ECC codec 200 is prepared to begin encoding and/or decoding for the data of the corresponding non-volatile memory (22a, 22b . . . or 22n) or the data of the corresponding pages (or blocks) of the non-volatile memory (22a, 22b . . . or 22n).

Figure 3A:
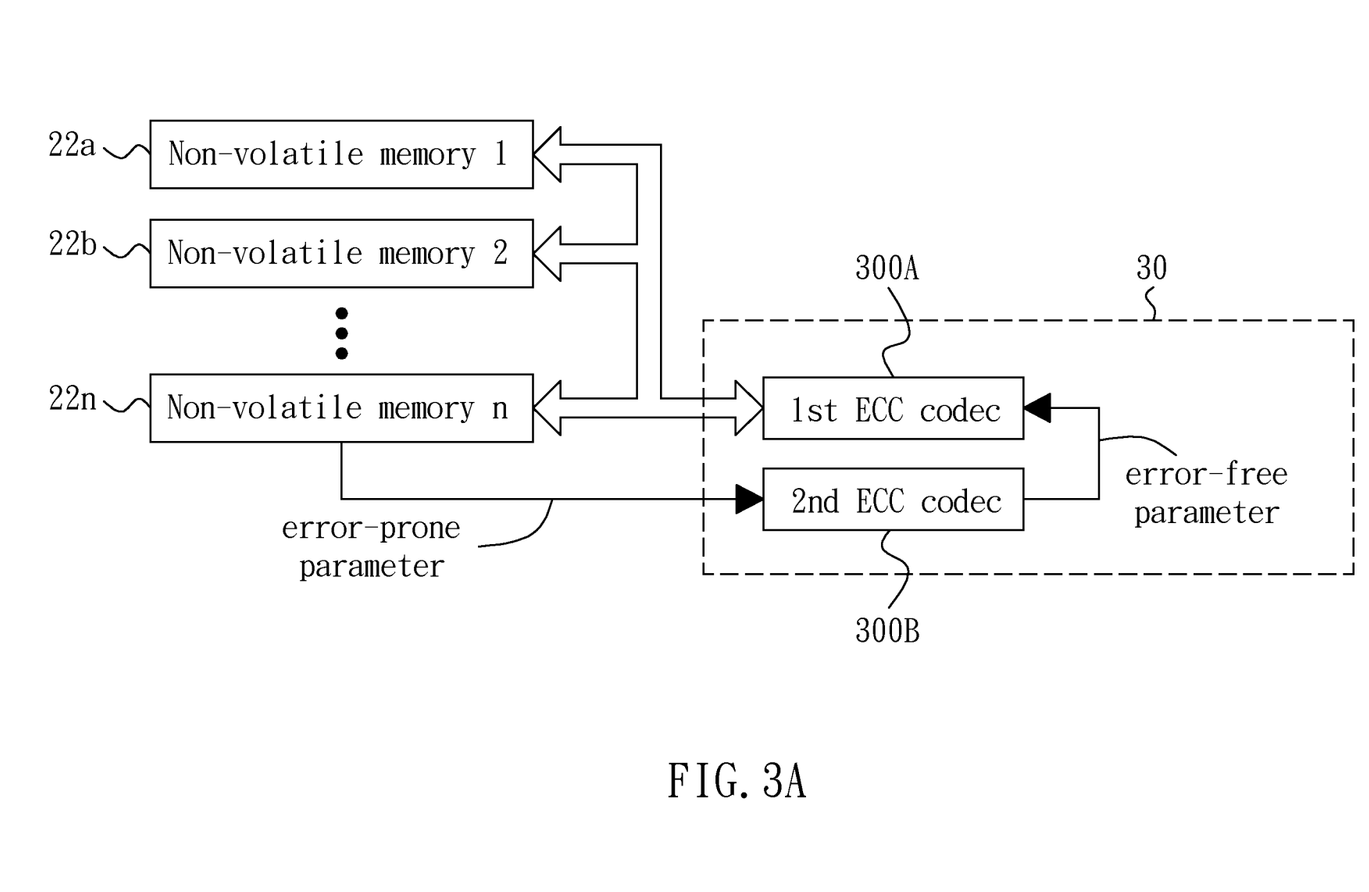
FIG. 3A shows a block diagram of a configurable coding system of multiple ECCs for memory devices according to a second specific embodiment of the present invention.
Figure 3B:
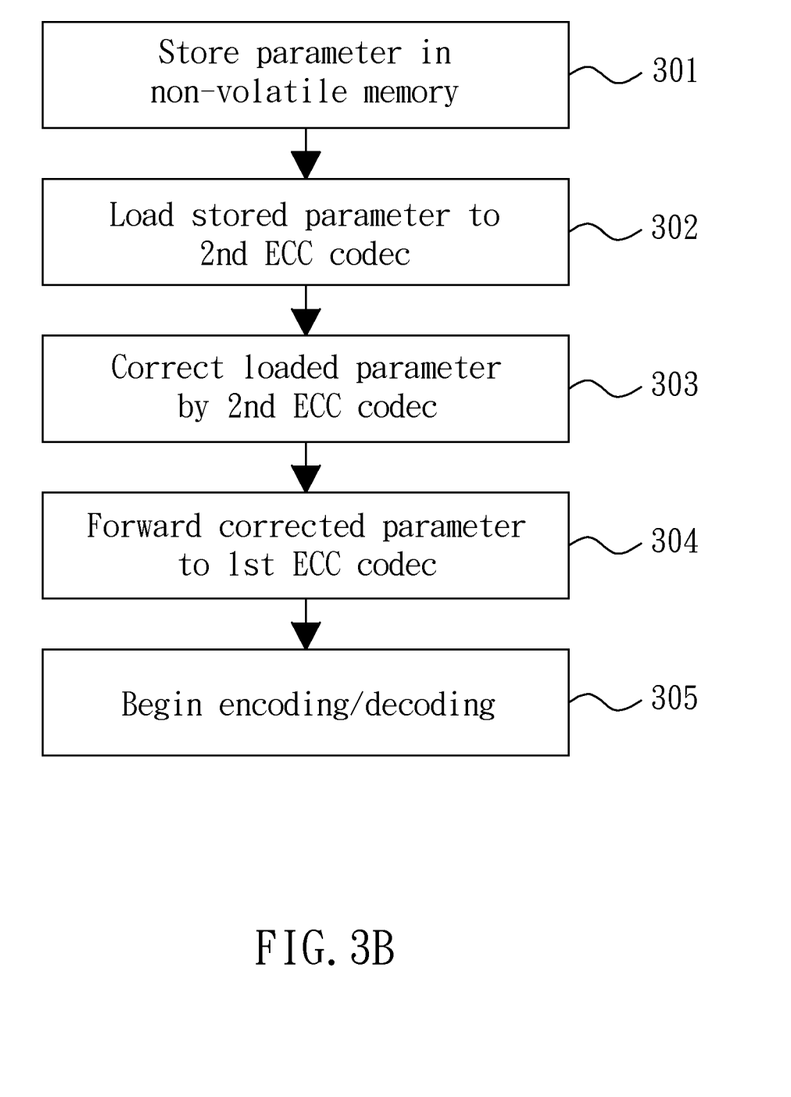
FIG. 3B shows a flow diagram of a configurable coding method of multiple ECCs for memory devices according to the second specific embodiment.

FIG. 3A shows a block diagram of a configurable coding system 30 of multiple ECCs for a memory device or devices such as non-volatile memories (22a-22n) (e.g., flash memory) according to a second specific embodiment of the present invention. FIG. 3B shows a flow diagram of a configurable coding method of multiple ECCs for memory devices according to the second specific embodiment.

In the embodiment, the coding system 30 includes a first ECC codec 300A that is configurable of performing different error corrections for the distinct non-volatile memories (22a-22n). The coding system 30 further includes a second (or supplementary) ECC codec 300B that is utilized to load parameter(s), needed for initializing the first ECC codec 300A, from an (error-prone) external memory device (e.g., a non-volatile memory). The non-volatile memory that stores the parameters may be one of the aforementioned non-volatile memories (22a-22n), or may be another separate non-volatile memory.

It is noted that the second ECC codec 300B itself is capable of correcting error of the loaded parameter(s) without need of initialization. For example, the second ECC codec 300B has built-in parameter(s), and is thus capable of performing error correction. Subsequently, the second ECC codec 300B outputs corrected or error-free parameter(s) to the first ECC codec 300A.

In step 301, parameter(s) are stored (or updated) in one or more (error-prone) non-volatile memories (22a, 22b . . . 22n) beforehand. Subsequently, in step 302, an associated portion of the stored parameters is loaded, for example, by a user, from the non-volatile memory to the second ECC codec 300B. Next, in step 303, the loaded parameter(s) is then subjected to error correction by the second ECC codec 300B. The corrected parameter(s) are then forwarded to facilitate the associated initialization of the first ECC codec 300A in step 304. After finishing the initialization, in step 305, the first ECC codec 300A is prepared to begin encoding and/or decoding for the data of the corresponding non-volatile memory (22a, 22b . . . or 22n). For example, if the loaded parameter(s) are associated with the second ECC (ECC2), the first ECC codec 300A is then prepared to begin encoding and/or decoding for the data of the second non-volatile memory 22b.

This second embodiment maintains the advantage of the first embodiment: the ECC codec does not bear the burden of storing a large amount of parameters. Compared to the first embodiment, as the parameters of the various ECC codes are stored in a non-volatile memory, such as an extra space of the non-volatile memory, in this second embodiment, it is noted that the cost of storing the parameters in the non-volatile memory is much smaller than storing the parameters in the error-free storage device(s). Moreover, the second embodiment has two ECC codecs 300A and 300B to be utilized. For example, the first ECC codec 300A may be a low-density parity-check (LDPC) codec, and the second codec 300B may be a BCH (named after Bose, Ray-Chaudhuri and Hocquenghem) codec.

Figure 4A:
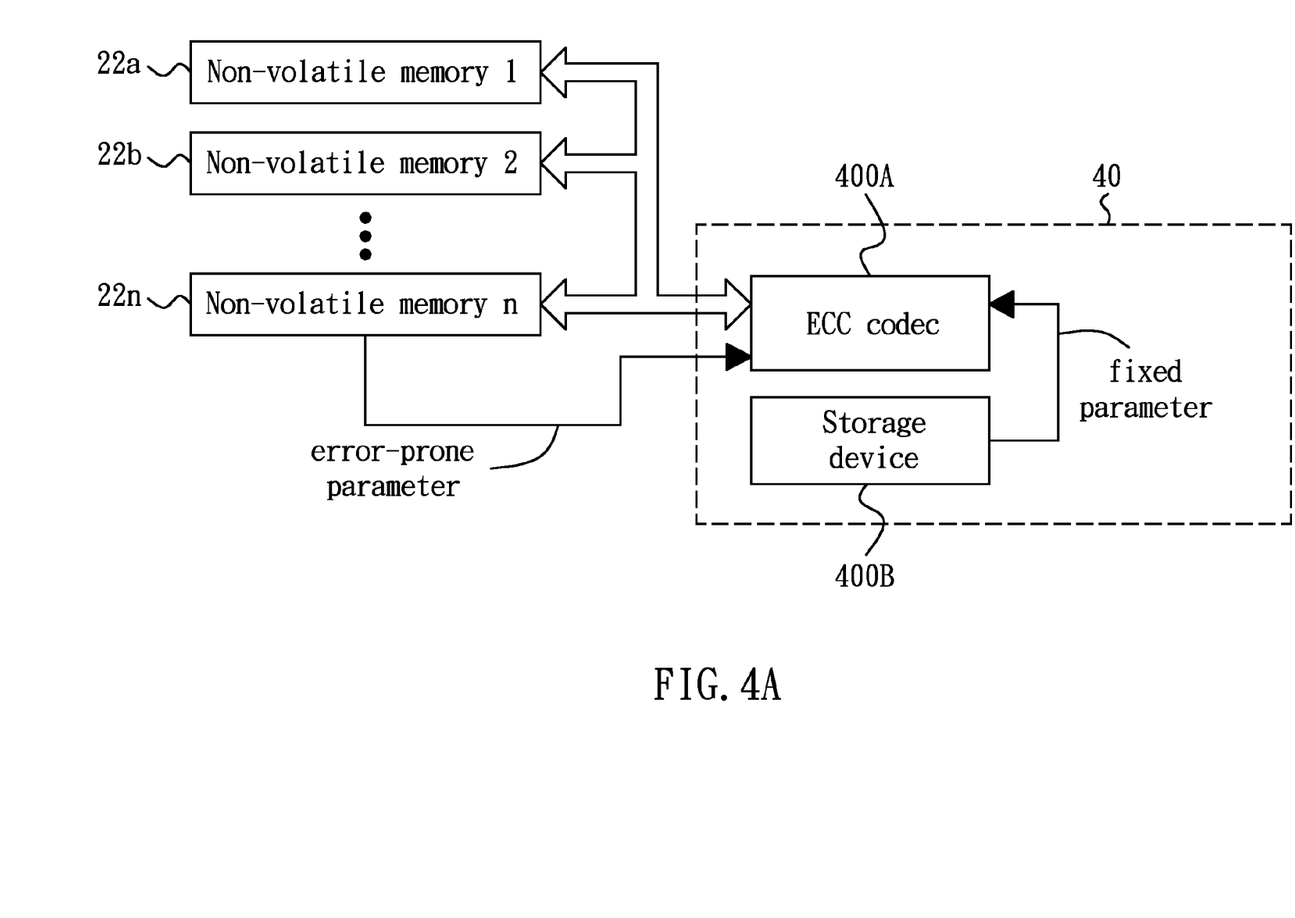
FIG. 4A shows a block diagram of a configurable coding system of multiple ECCs for memory devices according to a third specific embodiment of the present invention.
Figure 4B:
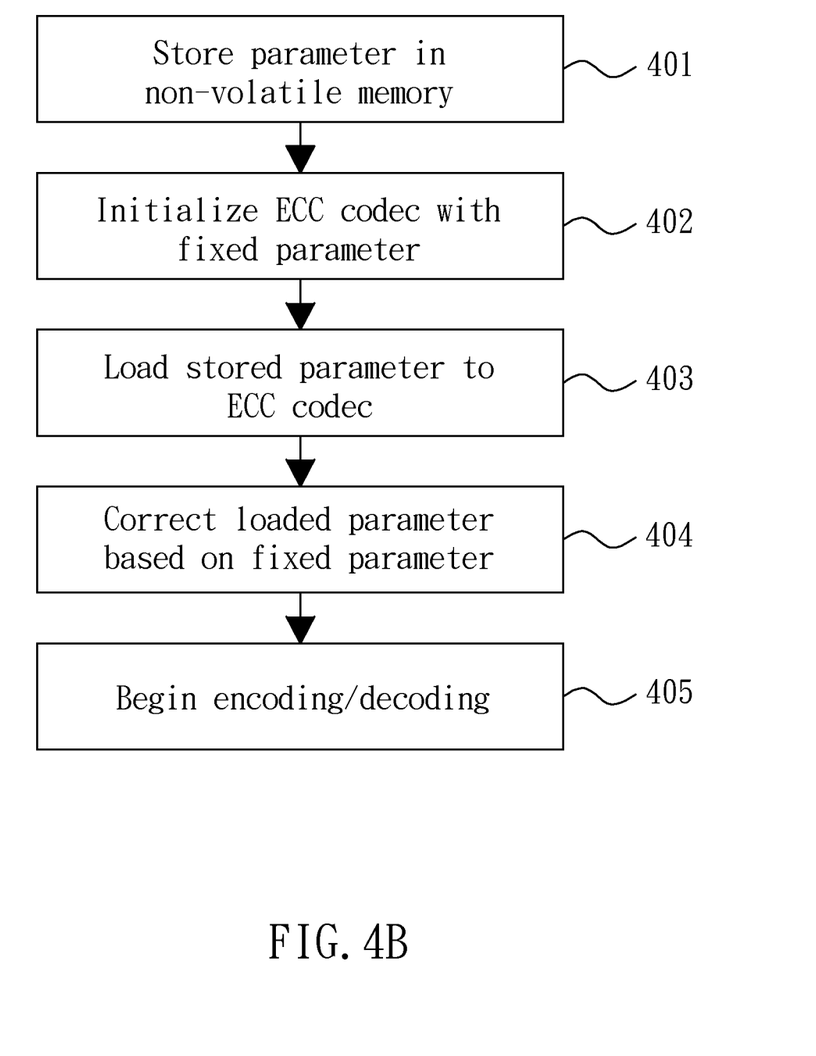
FIG. 4B shows a flow diagram of a configurable coding method of multiple ECCs for memory devices according to the third specific embodiment.

FIG. 4A shows a block diagram of a configurable coding system 40 of multiple ECCs for a memory device or devices such as non-volatile memories (22a-22n) (e.g., flash memory) according to a third specific embodiment of the present invention. FIG. 4B shows a flow diagram of a configurable coding method of multiple ECCs for memory devices according to the third specific embodiment.

In the embodiment, the coding system 40 includes an ECC codec 400A that is configurable of performing different error corrections for the distinct non-volatile memories (22a-22n). The coding system 40 further includes a storage device 400B such as SRAM or ROM that is utilized to store (error-free) fixed parameter(s). Based on the fixed parameter(s), the ECC codec 400A may load and correct parameter(s), needed for initializing the ECC codec 400A, from an (error-prone) external memory device (e.g., a non-volatile memory). It is noted that the ECC codec 400A is capable of correcting error of the loaded parameter(s) with the fixed parameter(s). The non-volatile memory that stores the parameters may be one of the aforementioned non-volatile memories (22a-22n), or may be another separate non-volatile memory.

In step 401, parameter(s) are stored (or updated) in one or more (error-prone) non-volatile memories (22a, 22b ... 22n) beforehand. Subsequently, in step 402, the ECC codec 400A is initialized with the fixed parameter(s). Next, in step 403, an associated portion of the stored parameters is loaded, for example, by a user, from the non-volatile memory to the ECC codec 400A. In step 404, the loaded parameter(s) is then subjected to error correction by the ECC codec 400A based on the fixed parameter(s). After initializing the ECC codec 400A by the corrected parameter(s), in step 405, the ECC codec 400A is prepared to begin encoding and/or decoding for data of the corresponding non-volatile memory (22a, 22b ... or 22n). For example, if the loaded parameter(s) are associated with the second ECC (ECC2), the ECC codec 400A is then prepared to begin encoding and/or decoding for the data of the second non-volatile memory 22b.

This third embodiment maintains the advantage of the first embodiment: the ECC codec does not bear the burden of storing a large amount of parameters. In addition, this third embodiment maintains the advantage of the second embodiment: cost of storing the parameters in the non-volatile memory is much smaller than storing the parameters in the error-free storage device(s).

With respect to the embodiments described above, in an exemplary embodiment, the LDPC code is selected to perform encoding/decoding for the data of the corresponding non-volatile memory. Specifically, a generating matrix is required for encoding information, and a parity check matrix is required for decoding a received signal. The parameters needed to initialize the encoder pertinent to the generating matrix are pretty large for hardware implementation. Similarly, the parameters needed to initialize the decoder pertinent to the parity check matrix are also pretty large. To support multiple ECCs, the system has to store different matrix for each LDPC ECC. According to the second and the third embodiments, the matrixes may now be loaded from a non-volatile memory, thereby making the system design more flexible and reducing cost of the coding system.

Although specific embodiments have been illustrated and described, it will be appreciated by those skilled in the art that various modifications may be made without departing from the scope of the present invention, which is intended to be limited solely by the appended claims.

What is claimed is:

1. A configurable coding system of multiple error correcting codes (ECCs), a parameter includes a matrix and different matrixes define different error correcting codes, comprising:

an ECC codec configured to selectively perform different error corrections with different parameters, the ECC codec being firstly initialized by an error-free pre-parameter;

an error-free storage device configured to store the error-free pre-parameter to be loaded to the ECC codec; and an external memory device configured to store the different parameters used for configuring the ECC codec and to store a data;

wherein the ECC codec loads one of the stored error-prone parameters from the external memory device, and corrects the loaded error-prone parameter based on the error-free pre-parameter, thereby generating an error-free corrected parameter that is then used to secondly initialize the ECC codec and correcting the data read from the external memory device.

2. The system of claim 1, wherein the storage device is a static random access memory (SRAM) or a read only memory (ROM), and the external memory device is a non-volatile memory.

3. The system of claim 1, wherein the ECC codec comprises an ECC decoder.

4. The system of claim 3, wherein the ECC codec further comprises an ECC encoder.

5. The system of claim 1, wherein the ECC codec performs a LDPC code.

6. A configurable coding method of multiple error correcting codes (ECCs), a parameter includes a matrix and different matrixes define different error correcting codes, comprising:

storing a plurality of different parameters;

providing a selected error-prone parameter used for configuring a ECC codec;

correcting the selected error-prone parameter to generate an error-free parameter for accordingly initializing the ECC codec; and selectively performing an error correction based on the selected error-prone parameter;

wherein the plurality of different parameters are stored in an external memory device, and an error-free storage device is configured to store an error-free pre-parameter to be loaded to the ECC codec to firstly initialize the ECC codec;

wherein the ECC codec loads one of the stored error-prone parameters from the external memory device, and corrects the loaded error-prone parameter based on the pre-parameter, thereby generating the error-free parameter to secondly initialize the ECC codec, and then correcting a data read from the external memory device.

7. The method of claim 6, wherein the ECC codec performs encoding, decoding or their combination.

8. The method of claim 6, wherein the error correction is performed for the data of at least one page of a non-volatile memory, the data of at least one block of a non-volatile memory, the data of at least one non-volatile memory or their combination.

9. The method of claim 8, wherein the non-volatile memory is a flash memory.

10. The method of claim 6, wherein the storage device is a static random access memory (SRAM) or a read only memory (ROM), and the external memory device is a non-volatile memory.

11. The method of claim 6, wherein the ECC codec performs a LDPC code.

* * * * *